US011405043B1

(12) United States Patent
Grave et al.

(10) Patent No.: US 11,405,043 B1
(45) Date of Patent: Aug. 2, 2022

(54) PHASE CALIBRATION WITH HALF-RATE CLOCK FOR INJECTION-LOCKING OSCILLATORS

(71) Applicant: QUALCOMM Incorporated, San Diego, CA (US)

(72) Inventors: Baptiste Grave, Shanagarry (IE); Stefano Facchin, Cork (IE)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 17/477,187

(22) Filed: Sep. 16, 2021

(51) Int. Cl.
  *H03L 7/24* (2006.01)
  *H03D 3/00* (2006.01)
  *H04L 7/033* (2006.01)
  *H04L 27/38* (2006.01)

(52) U.S. Cl.
  CPC .............. *H03L 7/24* (2013.01); *H03D 3/007* (2013.01); *H04L 7/033* (2013.01); *H04L 27/389* (2013.01); *H03D 2200/006* (2013.01)

(58) Field of Classification Search
  CPC ....... H03L 7/24; H03L 7/0814; H03L 7/0991; H03L 27/389; H04L 7/0331; H04L 7/033; H04L 2027/0053; H03D 3/007
  See application file for complete search history.

(56) References Cited

U.S. PATENT DOCUMENTS

| | | | |
|---|---|---|---|
| 4,021,743 A * | 5/1977 | Claxton | .............. H04L 27/2273 329/305 |
| 9,178,498 B2 | 11/2015 | Chong | |
| 9,270,289 B2 | 2/2016 | Walker et al. | |
| 9,735,791 B2 | 8/2017 | Zerbe et al. | |
| 9,832,006 B1 * | 11/2017 | Bandi | ........................ G06F 1/10 |
| 10,476,434 B1 | 11/2019 | Pandita et al. | |
| 10,855,296 B2 | 12/2020 | Bassi et al. | |
| 2015/0270943 A1 * | 9/2015 | Liu | ........................ H03L 7/0995 375/371 |
| 2019/0013929 A1 * | 1/2019 | Hailu | .................. H03K 5/00006 |
| 2019/0363702 A1 * | 11/2019 | Kuo | ...................... H03G 3/3036 |
| 2021/0152180 A1 * | 5/2021 | Shin | ........................ H03F 3/211 |

* cited by examiner

*Primary Examiner* — Khanh C Tran
(74) *Attorney, Agent, or Firm* — Loza & Loza, LLP

(57) ABSTRACT

A clock generation circuit has an injection-locked oscillator, a frequency doubler circuit, low pass filters and a calibration circuit. The injection-locked oscillator has an input coupled to a half-rate clock signal. The frequency doubler circuit has inputs coupled to outputs of the injection-locked oscillator. Each of the low pass filters has an input coupled to one of a plurality of outputs of the frequency doubler circuit. The calibration circuit includes comparison logic that receives outputs of the low pass filters. The calibration circuit has an output coupled to a control input of a source of a supply current in the injection-locked oscillator. In one example, the source of the supply current is a current digital to analog converter.

29 Claims, 11 Drawing Sheets

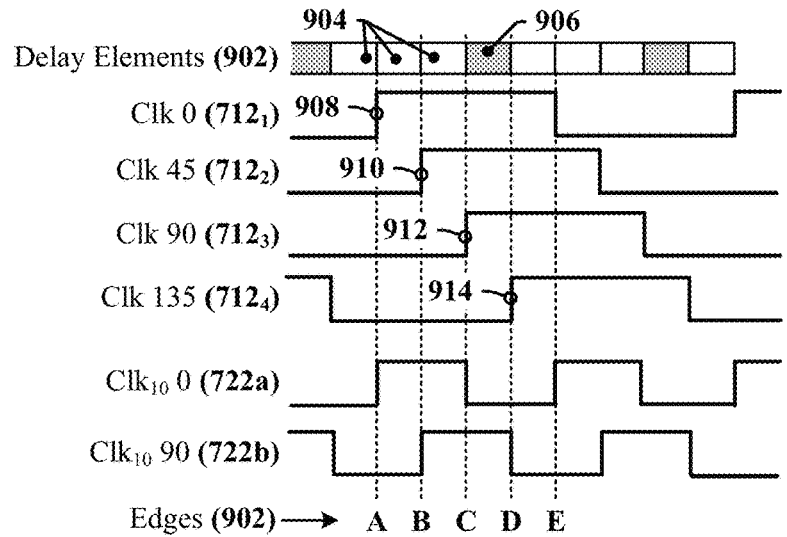

Phase And Delay Breakdowns

| | | Oscillator Too Fast | Ideal Oscillator Speed | Oscillator Too Slow |
|---|---|---|---|---|
| 5 GHz | clk0→clk45 delay (edge A→ edge B) | 24ps/43.2° | 25ps/45° | 26ps/46.8° |
| | clk45→clk90 delay (edge B→ edge C) | 24ps/43.2° | 25ps/45° | 26ps/46.8° |
| | clk90→clk135 delay (edge C→ edge D) | 28ps/50.4° | 25ps/45° | 22ps/39.6° |
| | clk135→clk0b delay (edge D→ edge E) | 24ps/43.2° | 25ps/45° | 26ps/46.8° |
| 10 GHz | Clk0 at logic 1 (edge A→ edge C) | 48ps | 50ps | 52ps |
| | Clk0 at logic 0 (edge C→ edge E) | 52ps | 50ps | 48ps |
| | Clk90 at logic 1 (edge B→ edge D) | 52ps | 50ps | 48ps |
| | Clk90 at logic 0 (edge D→ edge A) | 48ps | 50ps | 52ps |
| | Clk0 duty cycle | 48% | 50% | 52% |
| | Clk90 duty cycle | 52% | 50% | 48% |
| | Clk0 to Clk90 delay | 24ps/86.4° | 25ps/90° | 26ps/93.6° |

*FIG. 9*

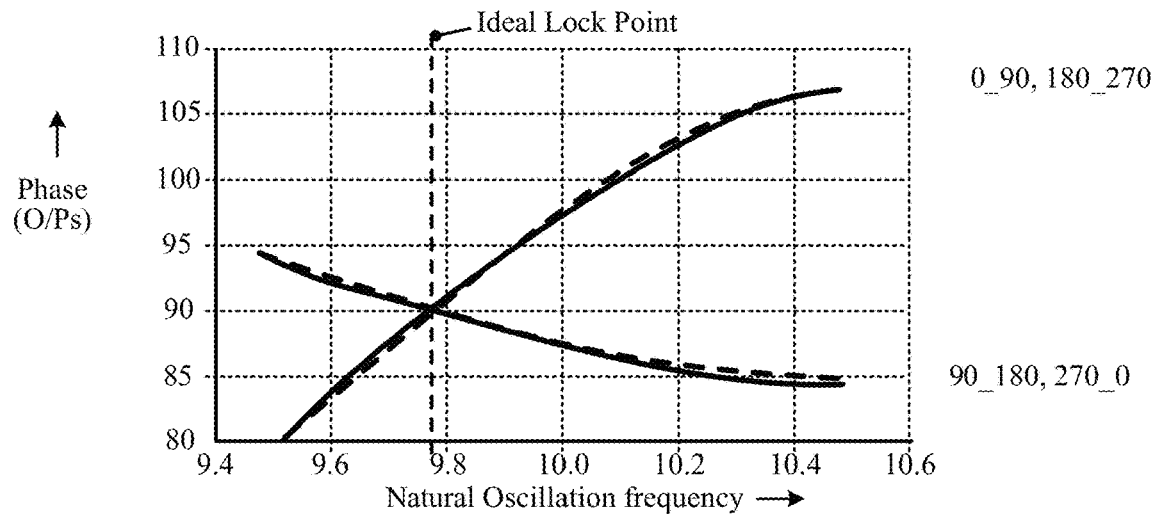
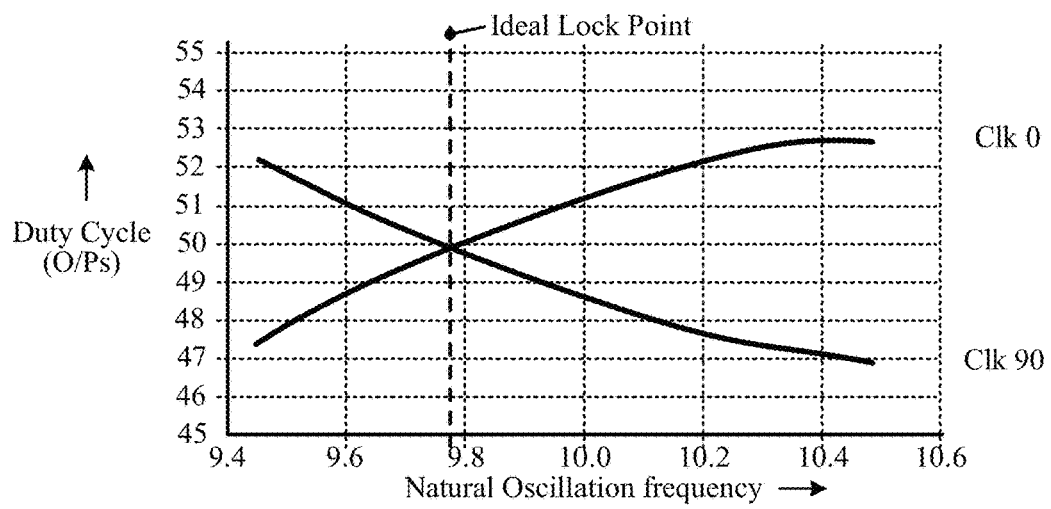
FIG. 10

PHASE CALIBRATION WITH HALF-RATE CLOCK FOR INJECTION-LOCKING OSCILLATORS

TECHNICAL FIELD

The present disclosure generally relates to a clock and data recovery circuits and, more particularly, to circuitry for generating multiple clock signals at different phases.

BACKGROUND

Electronic device technologies have seen explosive growth over the past several years. For example, growth of cellular and wireless communication technologies has been fueled by better communications, hardware, larger networks, and more reliable protocols. Wireless service providers are now able to offer their customers an ever-expanding array of features and services, and provide users with unprecedented levels of access to information, resources, and communications. To keep pace with these service enhancements, mobile electronic devices (e.g., cellular phones, tablets, laptops, etc.) have become more powerful and complex than ever. Wireless devices may include a high-speed bus interface for communication of signals between hardware components.

High-speed serial buses offer advantages over parallel communication links when, for example, there is demand for reduced power consumption and smaller footprints in integrated circuit (IC) devices. In a serial interface, data is converted from parallel words to a serial stream of bits using a serializer and is converted back to parallel words at the receiver using a deserializer. For example, the high-speed bus interface may be implemented using a Peripheral Component Interconnect Express (PCIe) bus, Universal Serial Bus (USB) or Serial Advanced Technology Attachment (SATA), among others.

IC devices may include a serializer/deserializer (SERDES) to transmit and receive through a serial communication link. In high-speed applications, timing of the operation of a SERDES may be controlled by multiple clock signals. The use of multiple increased frequency clock signals results in increased power consumption. Furthermore, the SERDES generally receives clock signals that have the same frequency but different phases. Performance, accuracy or reliability of the SERDES may depend on the phase relationships of the clock signals and drift or other variations in the phase relationships of clock signals can result in errors in received data. Therefore, there is an ongoing need for new techniques that provide reliable lower-power clock generation and calibration circuits for high-speed serial links.

SUMMARY

Certain aspects of the disclosure relate to systems, apparatus, methods and techniques for implementing and managing phase relationships for use with a high frequency deserializer. Some aspects relate to a low-power, high-speed injection-locked oscillator architecture and its calibration circuit. The injection-locked oscillator is operated at half rate, providing substantial power savings and eight phases produced by the injection-locked oscillator are provided to a frequency doubler circuit to produce output signals. The calibration circuit corrects for phase or frequency offsets in the output circuits without the addition of observation circuits that can introduce measurement errors.

In various aspects of the disclosure, a clock generation circuit includes an injection-locked oscillator having an input coupled to a half-rate clock signal, a frequency doubler circuit having a plurality of inputs coupled to a plurality of outputs of the injection-locked oscillator, low pass filters, each having an input coupled to one of a plurality of outputs of the frequency doubler circuit, and a calibration circuit that includes comparison logic that receives outputs of the low pass filters and that has an output coupled to a control input of a source of a supply current in the injection-locked oscillator.

In various aspects of the disclosure, an apparatus includes means for configuring an injection-locked oscillator to generate a plurality of phases of a half-rate clock signal, means for doubling the frequency of the plurality of phases of the half-rate clock signal to obtain a plurality of phases of a full-rate clock signal, means for comparing the plurality of phases of the full-rate clock signal including low pass filters configured to output low-pass filtered versions of the plurality of phases of the full-rate clock signal, and means for controlling a supply current in the injection-locked oscillator, including a current digital-to-analog converter configured to provide the circuit responsive to a comparison of outputs of the low pass filters.

In various aspects of the disclosure, a method for calibrating a clock generation circuit includes configuring an injection-locked oscillator to generate a plurality of phases of a half-rate clock signal; providing the plurality of phases of the half-rate clock signal to a frequency doubler circuit that outputs a plurality of phases of a full-rate clock signal; providing a plurality of phases of the full-rate clock signal to low pass filters; and configuring a calibration circuit to control a current digital-to analog converter (IDAC) in the injection-locked oscillator based on a comparison of outputs of the low pass filters.

In certain aspects, the source of the supply current in the injection-locked oscillator is a digital-to-analog converter. In one aspect, the comparison logic is configured to compare the outputs of the low pass filters. The frequency doubler circuit comprises exclusive-OR gates, each having inputs coupled to a differential signal provided by two of the plurality of outputs of the injection-locked oscillator. The calibration circuit may include a finite state machine.

In some aspects, the injection-locked oscillator includes a plurality of inverters connected in the loop. Each inverter has an input that is driven by a preceding stage and an output that drives a next stage. Each of the plurality of outputs of the injection-locked oscillator is coupled to an output of one of the plurality of inverters connected in the loop. The injection-locked oscillator may include back-to-back inverters coupled across the loop and between pairs of the plurality of inverters connected in the loop. The injection-locked oscillator may further include an injection circuit coupled across the loop and between a pair of the plurality of inverters connected in the loop In one aspect, the injection-locked oscillator includes one or more phase interpolators having inputs coupled to the plurality of outputs of the frequency doubler circuit. The injection-locked oscillator may include one or more sampling circuits, each sampling circuit receiving outputs of the one or more phase interpolators as inputs. An input of each of the one or more sampling circuits may be coupled to a data channel of a serial communication link.

BRIEF DESCRIPTION OF THE DRAWINGS

FIG. 9 is a timing diagram that illustrates certain aspects of the operation of the calibration circuit of FIG. 8.

FIG. 10 is a graph that illustrates certain aspects of the operation of the calibration circuit of FIG. 8.

DETAILED DESCRIPTION

Figure 1:
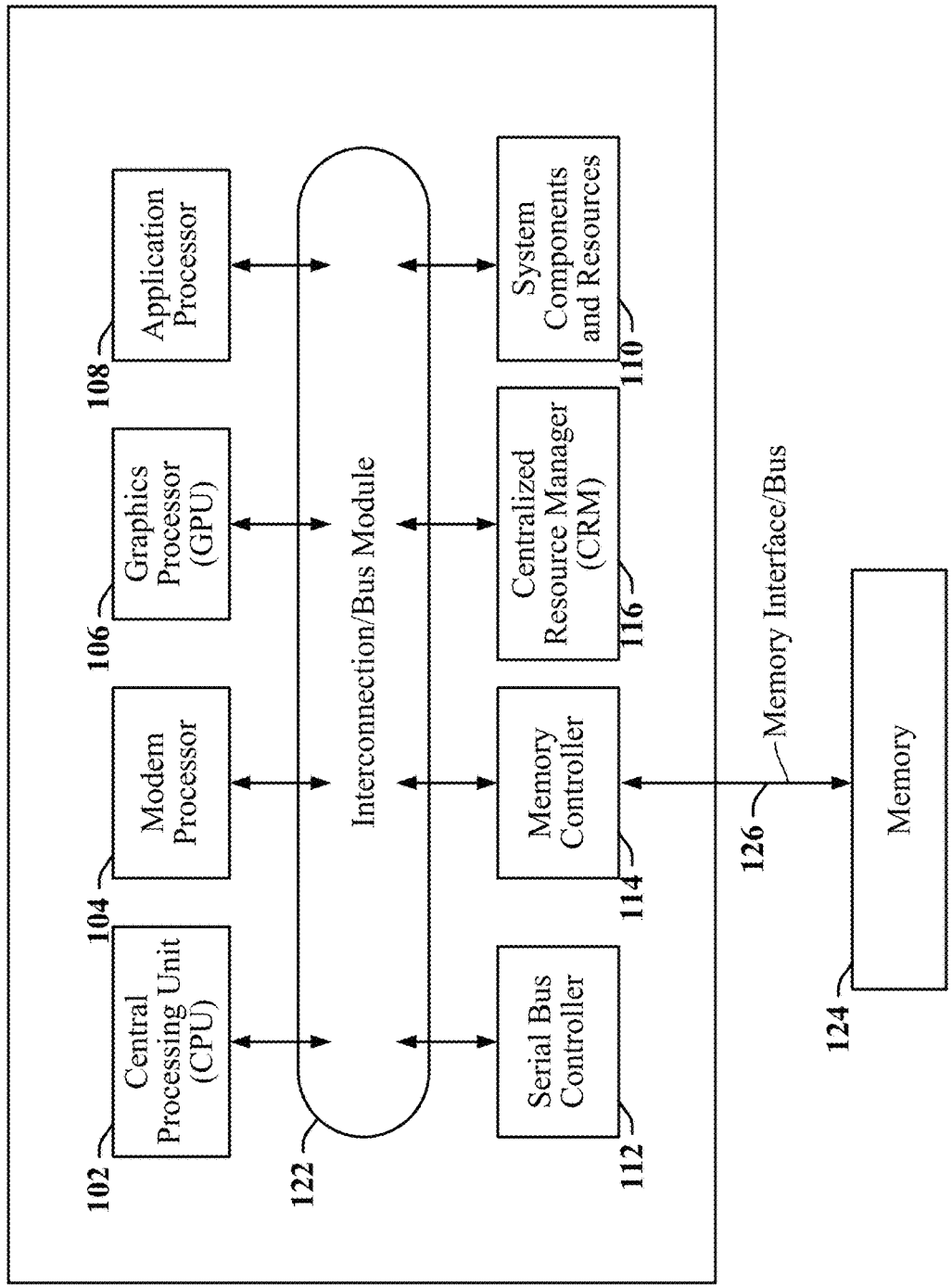
FIG. 1 illustrates an example of a system-on-a-chip (SOC) in accordance with certain aspects of the present disclosure.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well-known structures and components are shown in block diagram form in order to avoid obscuring such concepts.

With reference now to the Figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

The terms "computing device" and "mobile device" are used interchangeably herein to refer to any one or all of servers, personal computers, smartphones, cellular telephones, tablet computers, laptop computers, netbooks, ultrabooks, palm-top computers, personal data assistants (PDAs), wireless electronic mail receivers, multimedia Internet-enabled cellular telephones, Global Positioning System (GPS) receivers, wireless gaming controllers, and similar personal electronic devices which include a programmable processor. While the various aspects are particularly useful in mobile devices (e.g., smartphones, laptop computers, etc.), which have limited resources (e.g., processing power, battery, size, etc.), the aspects are generally useful in any computing device that may benefit from improved processor performance and reduced energy consumption.

The term "multicore processor" is used herein to refer to a single integrated circuit (IC) chip or chip package that contains two or more independent processing units or cores (e.g., CPU cores, etc.) configured to read and execute program instructions. The term "multiprocessor" is used herein to refer to a system or device that includes two or more processing units configured to read and execute program instructions.

The term "system on chip" (SoC) is used herein to refer to a single integrated circuit (IC) chip that contains multiple resources and/or processors integrated on a single substrate. A single SoC may contain circuitry for digital, analog, mixed-signal, and radio-frequency functions. A single SoC may also include any number of general purpose and/or specialized processors (digital signal processors (DSPs), modem processors, video processors, etc.), memory blocks (e.g., read only memory (ROM), random access memory (RAM), flash, etc.), and resources (e.g., timers, voltage regulators, oscillators, etc.), any or all of which may be included in one or more cores.

Memory technologies described herein may be suitable for storing instructions, programs, control signals, and/or data for use in or by a computer or other digital electronic device. Any references to terminology and/or technical details related to an individual type of memory, interface, standard, or memory technology are for illustrative purposes only, and not intended to limit the scope of the claims to a particular memory system or technology unless specifically recited in the claim language. Mobile computing device architectures have grown in complexity, and now commonly include multiple processor cores, SoCs, co-processors, functional modules including dedicated processors (e.g., communication modem chips, GPS receivers, etc.), complex memory systems, intricate electrical interconnections (e.g., buses and/or fabrics), and numerous other resources that execute complex and power intensive software applications (e.g., video streaming applications, etc.).

Process technology employed to manufacture semiconductor devices, including IC devices is continually improving. Process technology includes the manufacturing methods used to make IC devices and defines transistor size, operating voltages and switching speeds. Features that are constituent elements of circuits in an IC device may be referred as technology nodes and/or process nodes. The terms technology node, process node, process technology may be used to characterize a specific semiconductor manufacturing process and corresponding design rules. Faster and more power-efficient technology nodes are being continuously developed through the use of smaller feature size to produce smaller transistors that enable the manufacture of higher-density ICs.

FIG. 1 illustrates example components and interconnections in a system-on-chip (SoC) 100 that may be suitable for implementing certain aspects of the present disclosure. The SoC 100 may include a number of heterogeneous processors, such as a central processing unit (CPU) 102, a modem processor 104, a graphics processor 106, and an application processor 108. Each processor 102, 104, 106, 108, may include one or more cores, and each processor/core may perform operations independent of the other processors/cores. The processors 102, 104, 106, 108 may be organized in close proximity to one another (e.g., on a single substrate, die, integrated chip, etc.) so that the processors may operate at a much higher frequency/clock rate than would be possible if the signals were to travel off-chip. The proximity of the cores may also allow for the sharing of on-chip memory and resources (e.g., voltage rails), as well as for more coordinated cooperation between cores.

The SoC 100 may include system components and resources 110 for managing sensor data, analog-to-digital conversions, and/or wireless data transmissions, and for performing other specialized operations (e.g., decoding high-definition video, video processing, etc.). System components and resources 110 may also include components such as voltage regulators, oscillators, phase-locked loops (PLLs), peripheral bridges, data controllers, system controllers, access ports, timers, and/or other similar components used to support the processors and software clients running on the computing device. The system components and resources 110 may also include circuitry for interfacing with peripheral devices, such as cameras, electronic displays, wireless communication devices, external memory chips, etc.

The SoC 100 may further include a Universal Serial Bus (USB) or other serial bus controller 112, one or more memory controllers 114, and a centralized resource manager (CRM) 116. The SoC 100 may also include an input/output module (not illustrated) for communicating with resources external to the SoC, each of which may be shared by two or more of the internal SoC components.

The processors 102, 104, 106, 108 may be interconnected to the USB controller 112, the memory controller 114, system components and resources 110, CRM 116, and/or other system components via an interconnection/bus module 122, which may include an array of reconfigurable logic gates and/or implement a bus architecture. Communications may also be provided by advanced interconnects, such as high performance networks on chip (NoCs).

The interconnection/bus module 122 may include or provide a bus mastering system configured to grant SoC components (e.g., processors, peripherals, etc.) exclusive control of the bus (e.g., to transfer data in burst mode, block transfer mode, etc.) for a set duration, number of operations, number of bytes, etc. In some cases, the interconnection/bus module 122 may implement an arbitration scheme to prevent multiple master components from attempting to drive the bus simultaneously. The memory controller 114 may be a specialized hardware module configured to manage the flow of data to and from a memory 124 via a memory interface/bus 126.

The memory controller 114 may comprise one or more processors configured to perform read and write operations with the memory 124. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. In certain aspects, the memory 124 may be part of the SoC 100.

Figure 2:
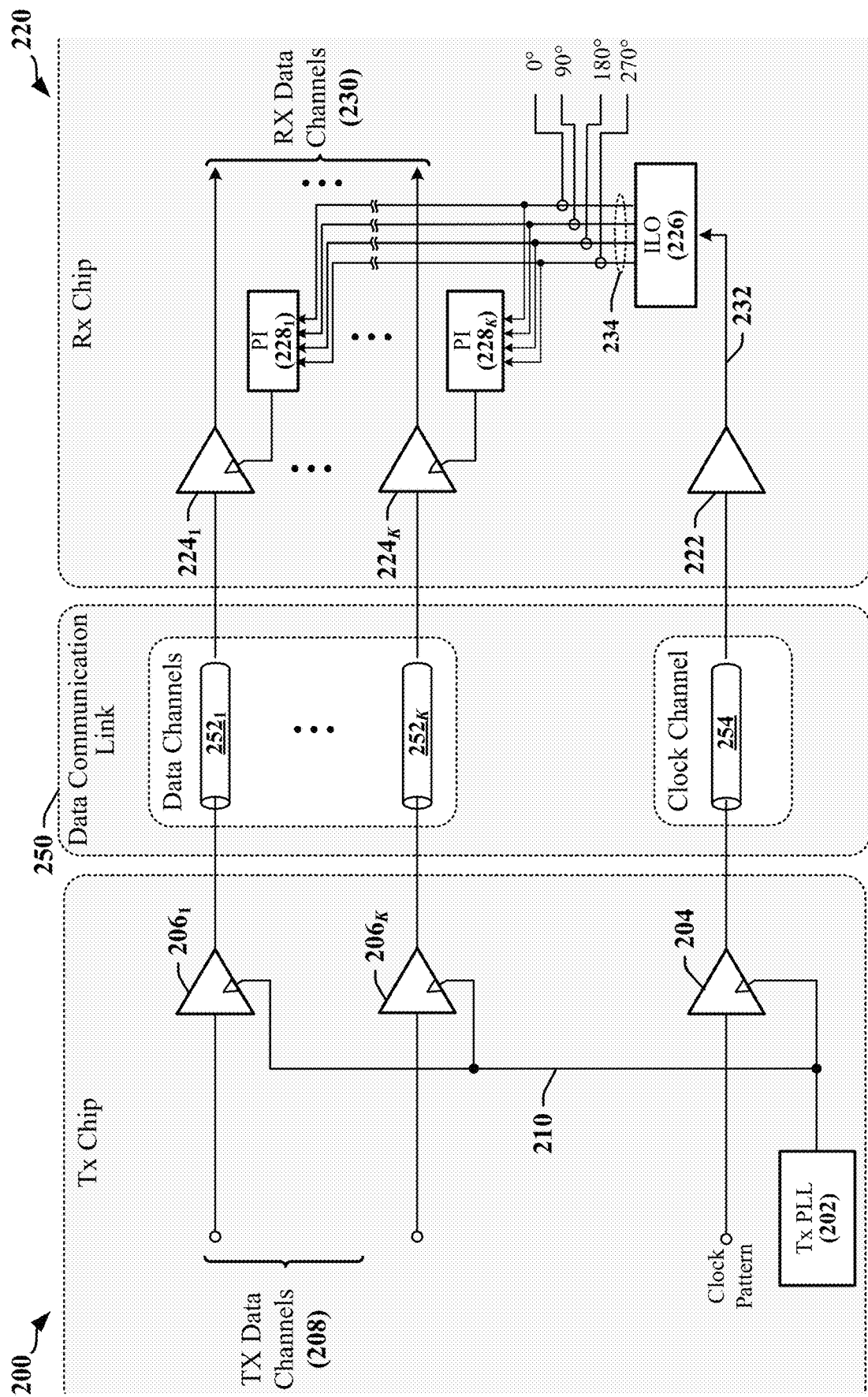
FIG. 2 illustrates an example of a system that employs a multi-channel data communication link.

FIG. 2 illustrates an example of a system that employs a multi-channel data communication link 250 to couple a transmitting device 200 with a receiving device 220. The data communication link 250 includes data channels $252_1$-$252_K$, 254 that provide a transmission medium through which signals propagate from a first device to a second device. In the illustrated example, the transmitting device 200 can be configured to transmit data signals over one or more data channels $252_1$-$252_K$ in accordance with timing information provided by a clock signal transmitted over a clock channel 254. The transmitting device 200 may include serializers (not shown) configured to convert parallel data into serial data for transmission over the data channels $252_1$-$252_K$. The transmitting device 200 further includes data drivers $206_1$-$206_K$ configured to generate data signals over the one or more data channels $252_1$-$252_K$ to the receiving device 220 through the data communication link 250 in accordance with timing information provided by a clock signal forwarded by a clock driver 204 over a clock channel 254.

Clock forwarding is common in communication systems, and provides the benefit that a phase locked loop (PLL) and other clock recovery circuits are not required in the receiving device 220. Long term jitter originating with a PLL 202 in the transmitting device 200 is transparent to the system. Typically, only one phase of the transmitter-generated clock signal is forwarded to conserve power and the space that would be occupied by additional clock channels. In some examples, multiple phases of the transmitter-generated clock signal are forwarded. In some examples, the transmitter-generated clock signal is forwarded as a differential clock signal.

The receiving device 220 may be configured to receive and process the data signals. The receiving device 220 may generate additional phases of the clock signal to obtain in-phase and quadrature (I/Q) versions of the clock signal to be used by phase interpolators $228_1$-$228_K$. A quadrature signal has phase that is shifted by 90° with respect to an in-phase signal. The phase interpolators $228_1$-$228_K$ may provide outputs that are phase-adjusted or phase-corrected I/Q versions of the clock signal. In one example, the outputs of each of the phase interpolators $228_1$-$228_K$ are provided to sampling circuits $224_1$-$224_K$.

The receiving device 220 may include an injection-locked oscillator (ILO) that receives the clock signal from a line receiver 222 coupled to the clock channel 254 and generates phase-shifted versions of the clock signal, including I/Q versions of the clock signal. Oscillators are fundamental building blocks of modern electronics and most often are implemented as ring oscillators (ROs), which can offer advantages over other types of oscillator including reduced area footprint, power efficiency and scalability with technological process.

Figure 3:
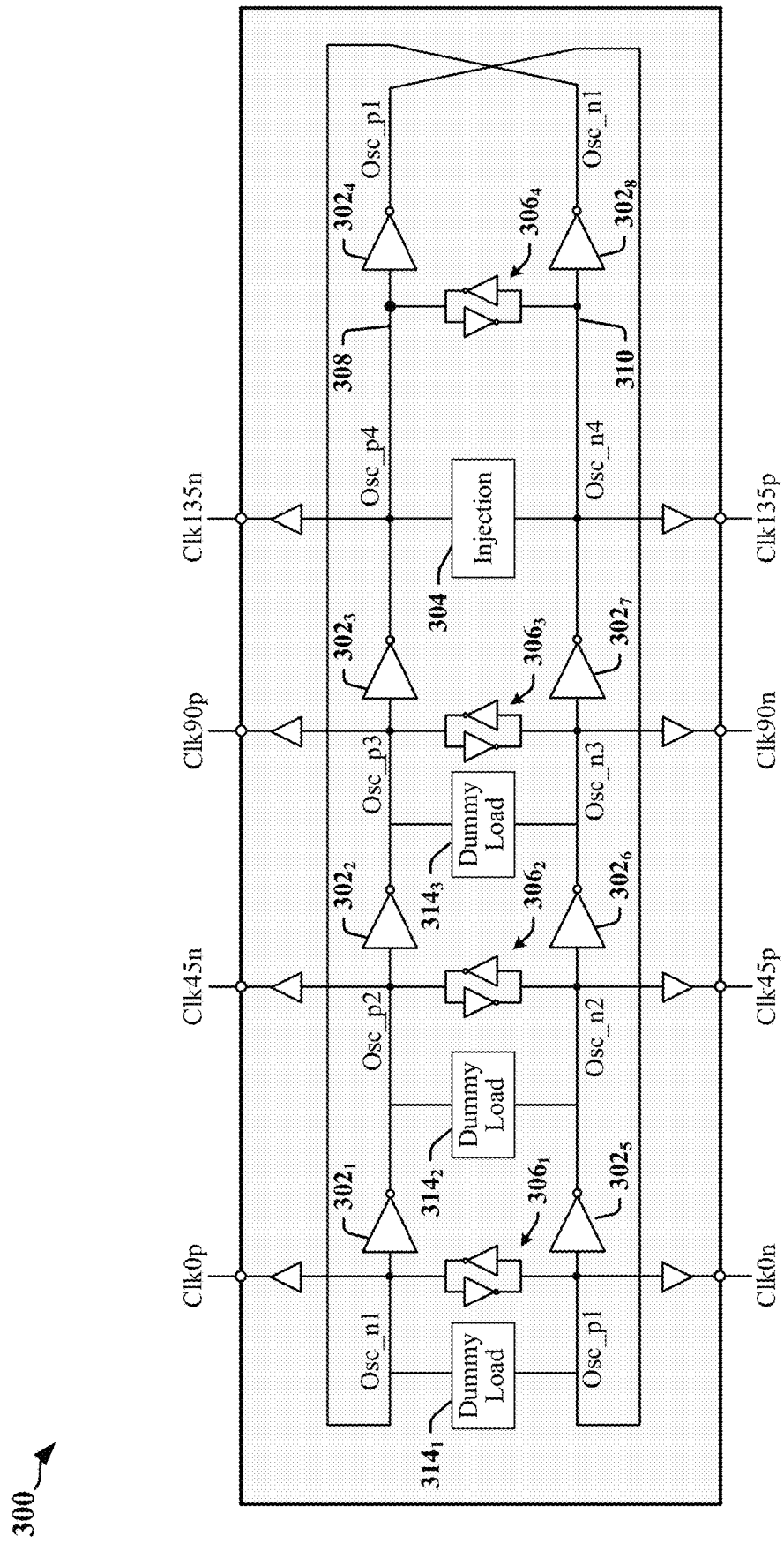
FIG. 3 illustrates an example of an injection-locked ring oscillator that may be adapted in accordance with certain aspects of this disclosure.
Figure 4:
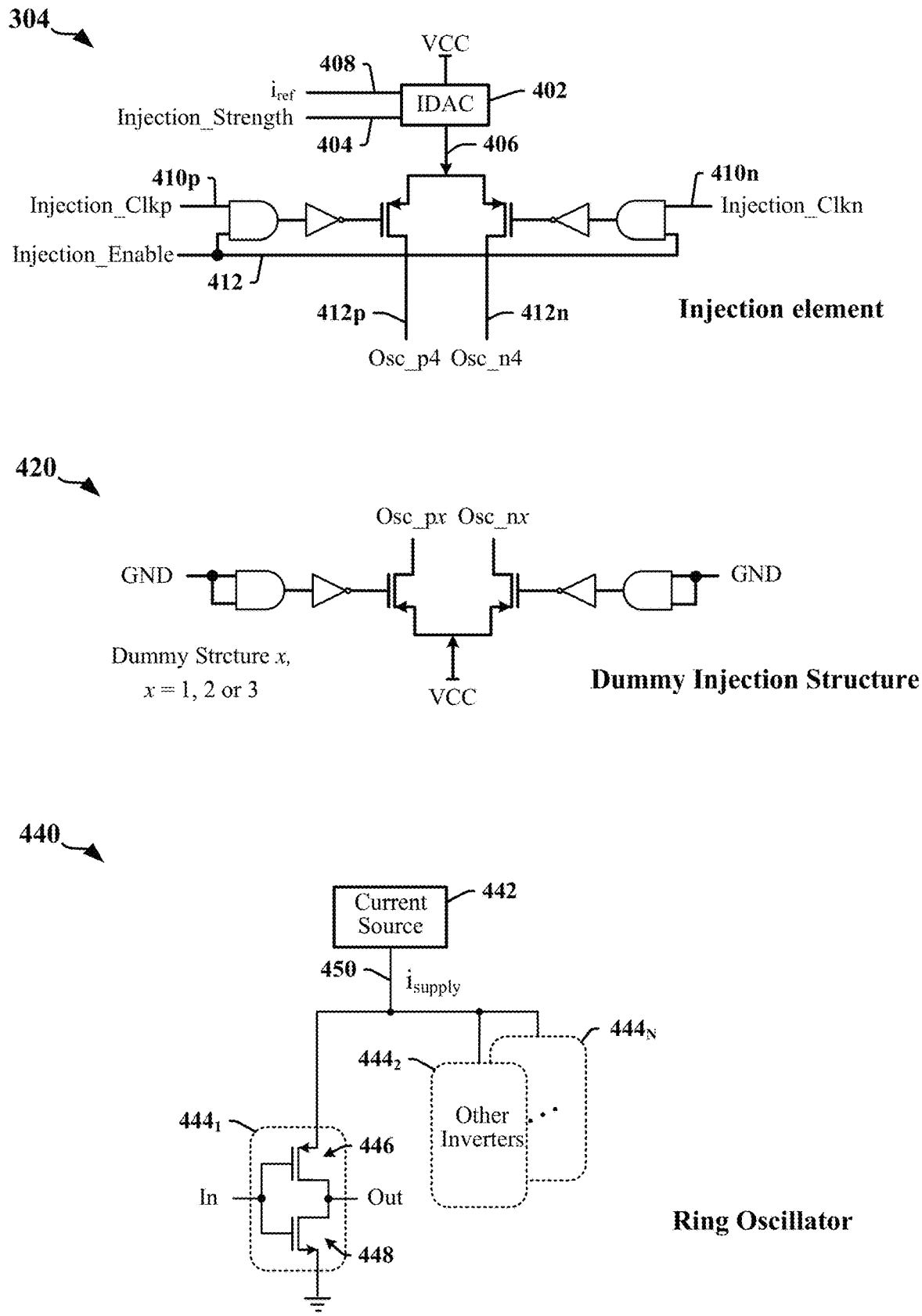
FIG. 4 illustrates an example of an injection element, an example of a dummy injection structure, and an example of an inverter in a ring oscillator that may be adapted in accordance with certain aspects of this disclosure.

FIG. 3 illustrates an example of an injection-locked ring oscillator (the ILO 300). The ILO 300 can be locked to an injected external signal that has a frequency near the operating frequency or free-running frequency of the ILO 300. The ILO 300 includes a number of stages $302_1$-$302_8$ connected in a loop. In one example, pairs of back-to-back inverters $306_1$-$306_4$ are provided to create sufficient phase shift between the stages $302_1$-$302_4$ and corresponding stages $302_5$-$302_8$ to create oscillation. The gain around the loop is equal to unity and the accumulated phase shift is equal to a multiple of 360°. In one example, each of the stages $302_1$-$302_8$ connected in a loop includes an inverter configured with an input driven by a preceding stage $302_1$-$302_8$ and an output that drives a next stage $302_1$-$302_8$. For an odd number of inverters n, the inverter's delay τ sets the free-running oscillation frequency $f_0 = (2n\tau)^{-1}$, with phase difference between stages=360°/n. The ILO 300 provides multiple quadrature phases of the same clock. The illustrated ILO 300 is a ring oscillator that has an even number of stages $302_1$-$302_8$ and that can produce accurate quadrature phase outputs if a mode of oscillation (180° shift between each stage $302_1$-$302_8$) can be excited. An injection element 304 or a dummy load $314_1$-$314_3$ cross couples each differential phase of the oscillator. This cross-coupling can be used to overcome direct current (DC) mode gain. With reference also to FIG. 4, a current digital-to-analog converter (the IDAC 402) in the injection element 304 provides an injection current 406 that is controlled by the value of an injection strength control input 404. In some instances, the ILO 300 may be implemented using a voltage-controlled RO. In some examples, the ILO 300 may be implemented using a current-starved RO in which a bias current or supply current is provided by a current source. In some examples, the bias current is provided by an IDAC (see the IDAC 510 in FIG. 5). In comparison to voltage-controlled ROs, current-starved ROs can be more easily controlled over process-voltage and temperature (PVT) variations. The inclusion of an IDAC to control the bias current or supply current enables the ILO 300 to operate as a digitally controlled oscillator (DCO). This architecture can be exploited to inject timed bursts of current and lock the oscillator to a desired frequency.

In the example injection element 304 illustrated in FIG. 4, the IDAC 402 outputs a scaled version of a reference current 408 ($i_{ref}$) as an injection current 406. The injection current 406 is used to control the injection strength based on the value of an injection strength control input 404. The injection current 406 is injected alternatively to one phase or the other of the oscillator based on the input reference clock polarity 410$p$, 410$n$ when the enable control signal 412 is high. In the illustrated example, the injection element 304 is coupled to a pair of nodes 308, 310 (Osc_p4 and Osc_n4) used for injection in the ILO 300.

Dummy loads 314$_1$-314$_3$ are coupled to the other pairs of nodes: Osc_p1/Osc_n1, Osc_p2/Osc_n2 and Osc_p3/Osc_n3. In some examples, the dummy loads 314$_1$-314$_3$ can be implemented using the dummy injection structure 420 shown in FIG. 4. The dummy injection structures 420 may be coupled to each of the other pairs of nodes in the ILO 300 for load matching purposes and to ensure that all phase delay elements have identical circuit elements.

FIG. 4 shows certain aspects of a ring oscillator 440 that may be adapted in accordance with certain aspects of this disclosure. The ring oscillator 440 includes a number (N) of inverters 444$_1$-444$_N$ that receive a supply current 450 from a current source. The magnitude of the supply current 450 can be adjusted to tune the ring oscillator 440. A first inverter 444$_1$ is illustrated as having a pair of transistors 446, 448, although other configurations and types of inverter may be used. The inverters 444$_1$-444$_N$ may be arranged or configured to provide the ILO 300.

The ILO 300 may be configured to free run at a frequency close to a target frequency. In one example, the target frequency may be 10 GHz and the ILO 300 may be configured to free run at 9.9 GHz. When in a free-running mode, each stage 302$_1$-302$_8$ contributes a delay of 12.6 picoseconds calculated as $f_0=(1/9.9\times10^9)/8=12.6$ ps. When injection locked, one of the stages 302$_1$-302$_8$ is forced to switch faster, with a delay of 11.8 ps in the illustrated example. The overall locked frequency of oscillation ($f_{Lock}$) can be calculated as follows:

$$f_{Lock} = \frac{10^{12}}{((7 \times 12.6) + 11.8)} Hz = \frac{10^{12}}{100} Hz = 10 \text{ GHz}.$$

The output signals can be generated using a differential input clock signal at the target frequency. The major portion of jitter in the output signals is inherited from the input clock signal rather than from the free running current controlled oscillator.

Figure 5:
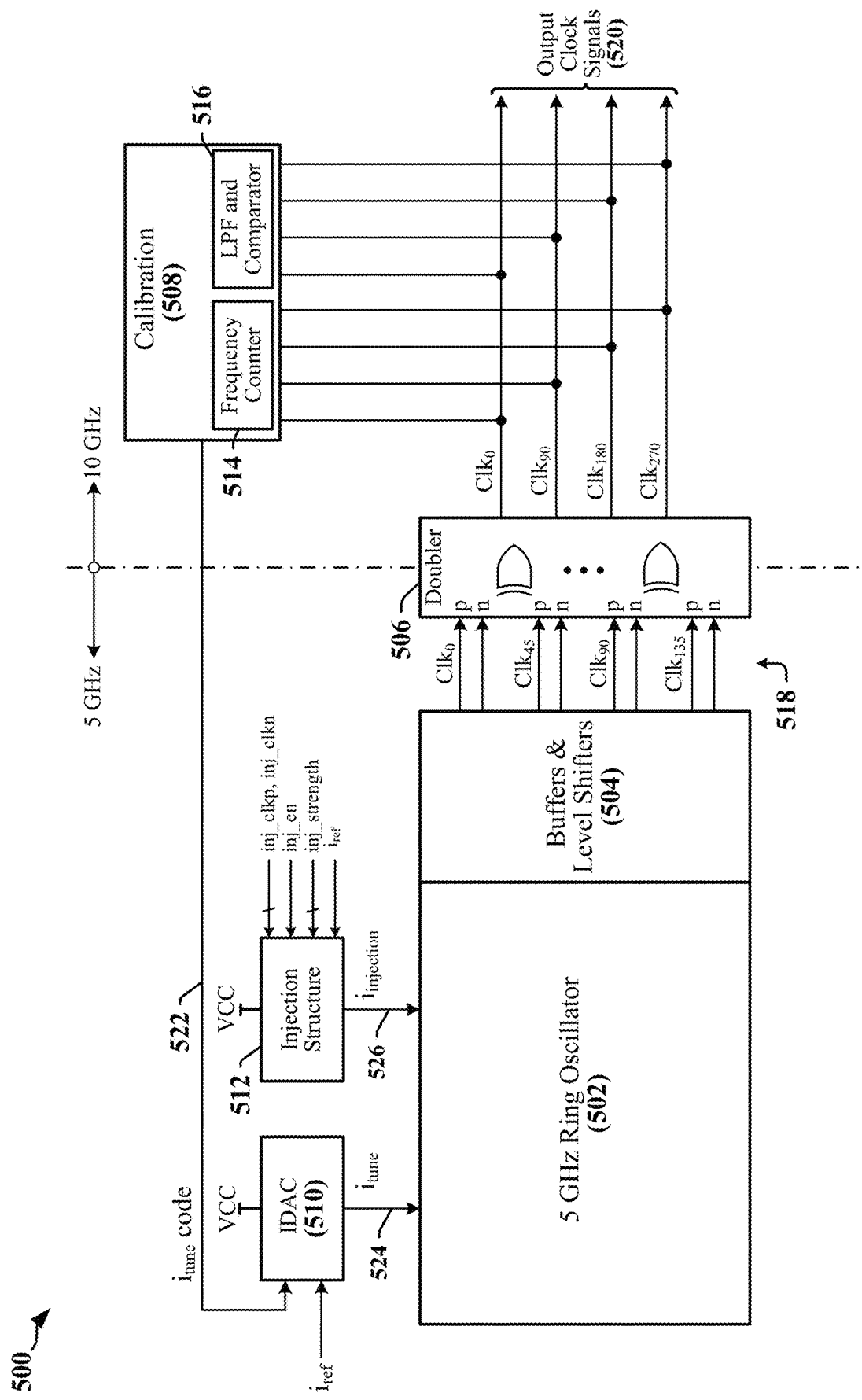
FIG. 5 illustrates calibration of a clock generation system that includes an injection-locked oscillator.

FIG. 5 illustrates calibration of a clock generation system 500 that includes an ILO 502. The ILO 502 may correspond to the ILO 300 illustrated in FIG. 3. The ILO 502 produces phases of a 5 GHz clock signal and includes, or is coupled to buffers, level shifters and other circuits 504 that provide a set of clock phases 518 to a frequency doubler circuit 506. For the purpose of this disclosure, a term such as "phases of a 5 GHz clock signal" refers to signals derived from the 5 GHz clock signal that differ from one another in phase shift. In another example, the term "phases of a 10 GHz clock signal" refers to signals derived from the 10 GHz clock signal that differ from one another in phase shift. The frequency doubler circuit 506 outputs clock signals 520 with different phase shifts. A calibration circuit 508 can be used to implement a feedback loop. In one example, the calibration circuit 508 includes a frequency counter 514 and a duty cycle comparison circuit 516 that may be implemented using low-pass filters. The calibration circuit 508 provides a control code 522 that operates to tune the ILO 502. The control code 522 may cause a current digital-to-analog converter (the IDAC 510) to provide a supply or bias current 524 ($i_{tune}$) used to tune the ILO 502. An injection-locking circuit in the ILO 502 may be configured to operate as a current-starved RO using an injection structure 512 that may set, for example, a base level of the injection current 526. The injection structure 512 may correspond to the injection-locking structure 320 illustrated in FIG. 3.

The current-starved RO frequency is a function of the supply or bias current 524, which here includes $i_{tune}$. In one example, the ILO 502 operates at a core frequency of 5 GHz to realize an output clock signal frequency of 10 GHz. The ILO 502 is considered to be frequency-locked when the output frequency is constant at 10 GHz after injection is enabled by the injection structure 512. Typically, the phases of the clock signals 520 are required to be accurately offset when the ILO 502 is locked at the target frequency.

Figure 6:
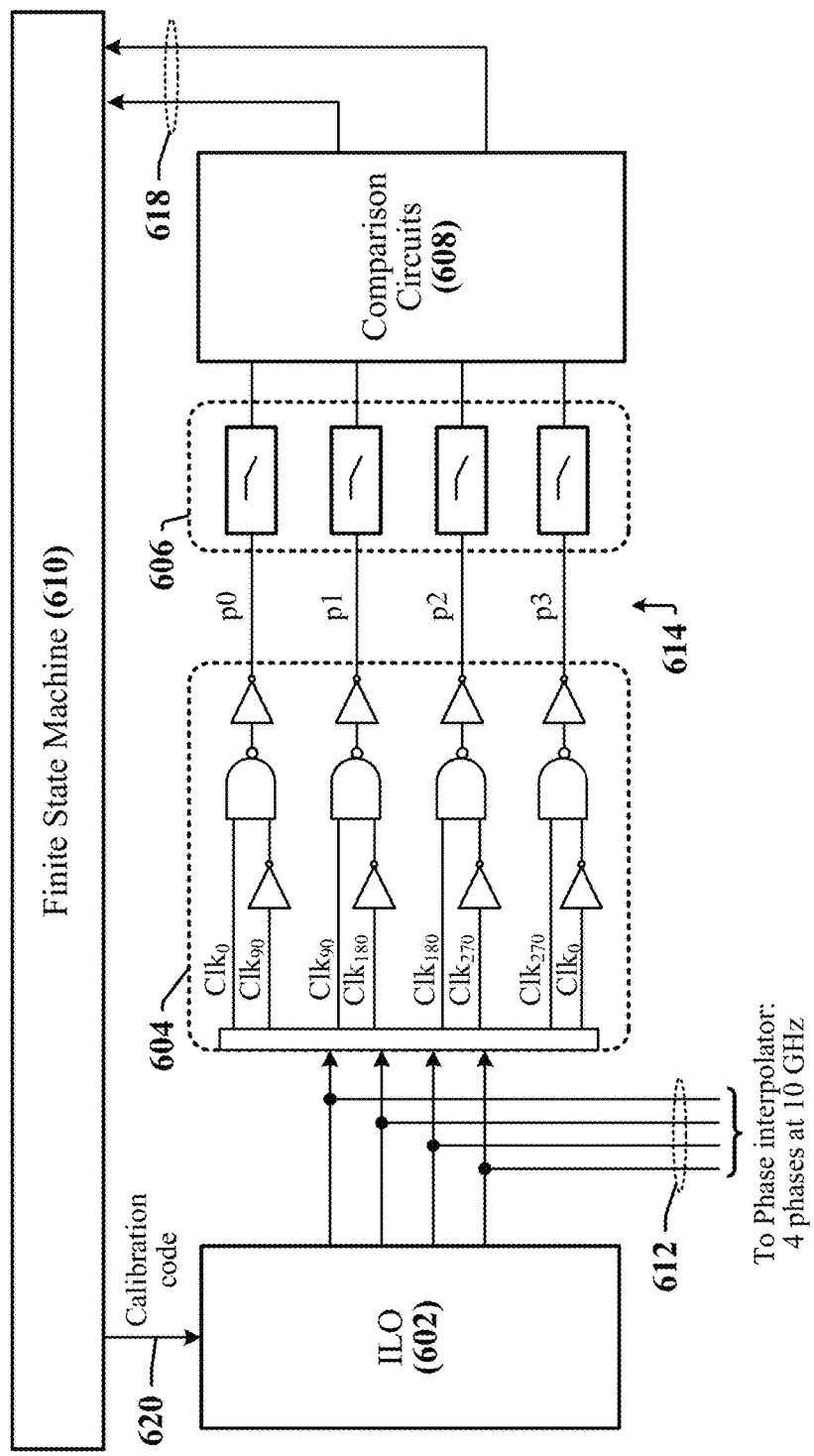
FIG. 6 illustrates an example of a calibration system for an oscillator.

Conventional calibration circuits 508 can introduce additional errors that must be known and accommodated when measuring and calibrating phase mismatches between outputs. FIG. 6 is a block representation of a conventional calibration system 600 for a clock generation circuit. In some examples, the calibration system includes at least some of the components of the calibration circuit 508, the IDAC 510 and/or the injection structure 512 illustrated in FIG. 5. In the example illustrated in FIG. 6, the calibration system 600 includes a finite state machine 610 (FSM) that controls the calibration process. The finite state machine 610 responds to the outputs of comparison circuits 608 and provides a calibration code 620 that may be used to configure injection circuits in an ILO 602. The ILO 602 may be configured to provide a set of phases 612 to a phase interpolator used to provide timing signals to sampling circuits or deserializers.

The calibration system 600 observes the set of phases 612 by generating pulses from the set of phases 612 using pulse generation circuits 604. Each pulse generation circuit 604 generates a pulsed signal 614 that has a duty cycle based on the difference in phase of two rising edges of the set of phases 612. Differences in pulse width between the pulsed signals 614 may indicate phase mismatches in the set of phases 612. The pulsed signals 614 are averaged to obtain a measurement of average voltage or power in the pulsed signals 614. In some examples, the pulsed signals 614 are averaged using low pass filters. The duty cycle of the pulsed signals 614 affects the average voltage or power measured in the pulsed signals 614. The comparison circuits 608 produce decision signals 618 that can be used by the finite state machine 610 to determine differences in phase offsets in the set of phases 612. The finite state machine 610 may respond to the decision signals 618 and/or by configuring a value of the calibration code 620 used to configure supply current circuits in an ILO 602. In some examples, two IDACs may be employed. One IDAC in the injection structure 512 controls the strength of the injection current 526 ($i_{injection}$) and the other IDAC 510 provides a supply or bias current 524 ($i_{tune}$) that is dynamically updated using a calibration algorithm.

Figure 7A:
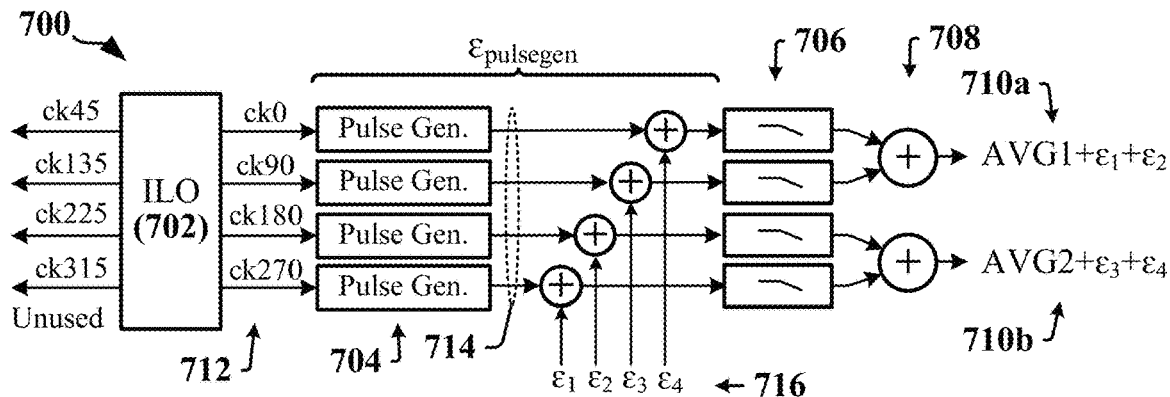
FIG. 7A illustrates the effect of errors introduced by the generation of calibration pulses in a calibration system.

The calibration system 600 can introduce additional phase errors in measurement circuits and these additional phase errors may not affect the set of phases 612 used to generate sampling clock signals. In some examples, the calibration system 600 optimizes the duty cycles of pulsed signals 614 rather than the phase offsets of the set of phases 612 used to generate sampling clock signals. The conceptualized calibration system 700 in FIG. 7A illustrates an example of the effect of errors 716 that may be introduced by the generation of calibration pulses in pulse signals 714 from multiple phases 712 output by an ILO 702. The calibration pulses are generated using pulse generation circuits 704 and the averages, which may be a function of I/Q delay, can be obtained using low pass filters 706 in some examples. In one example, a first comparison value 710a is obtained by comparing the average value measured or calculated for pulse signals 714 generated from the clk0 and clk90 phases 712 and a second comparison value 710b is obtained by comparing the average value measured or calculated for pulse signals 714 generated from the clk90 and clk180 phases 712. The comparison values 710a, 710b, which may be used to update the calibration code until an ideal value is reached, can be affected by errors or offsets introduced by the pulse generation circuits 704. In the illustrated example, each pulse signal 714 is assigned an error value ($\varepsilon 1$-$\varepsilon 4$) that is reflected in the comparison values 710a, 710b.

Figure 7B:
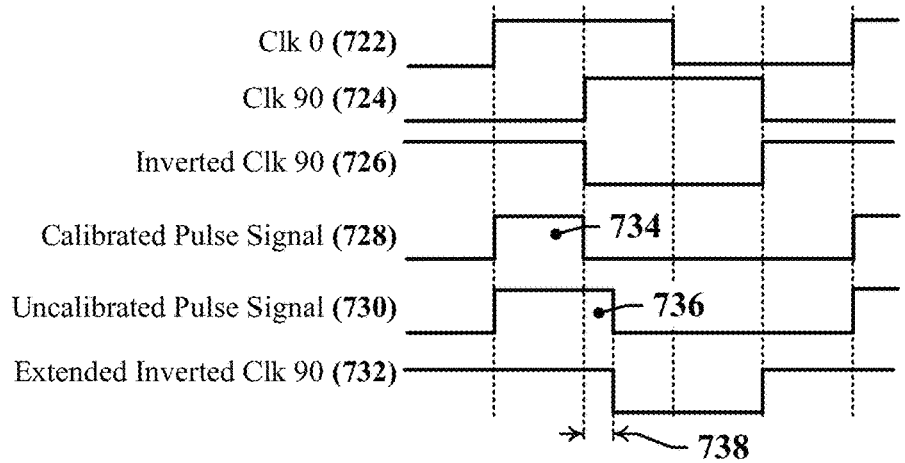
FIG. 7B is a timing diagram that illustrates the effect of errors introduced by the generation of calibration pulses in a calibration system.
Figure 7C:
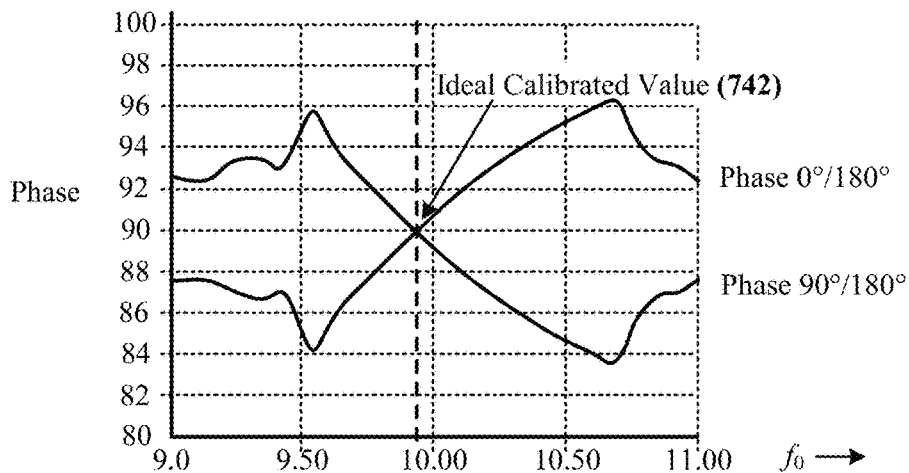
FIG. 7C is a graph that illustrates the effect of errors introduced by the generation of calibration pulses in a calibration system.

The timing diagram 720 in FIG. 7B illustrates the effect of an error in pulse generation circuits 704. The pulse generation circuits 704 may be assumed to correspond directly the pulse generation circuits 604 in FIG. 6 and the pulses are obtained by performing a logical AND function on an I/Q pair of signals, where the I signal is un-inverted and the Q signal is inverted before the AND function. The timing diagram 720 illustrates an example where Clk 0 722 represents the I signal and Clk 90 724 represents the Q signal. The AND function operates on Clk 0 722 and the inverted Clk 90 726, producing a pulse 734 in a calibrated pulse signal 728 during the overlap of high states for Clk 0 722 and inverted Clk 90 726. The timing diagram 720 illustrates an example of a delay introduced in the inverted Clk 90 726 to produce an extended Clk 90 732 in an uncalibrated pulse signal 730. In this example, the difference 738 in durations of pulses 734 and 736 represents an error introduced by the calibration system 700 that is not propagated to the data sampling circuits until calibration is applied. Calibration may be based on a signal with an error and when calibration is applied, the reference signal has an error such that the output result has an error. The graphs 740 in FIG. 7C illustrate the ideal calibrated value 742 that may occur when both the pulses for Clk0/Clk90 and Clk90/Clk180 coincide at 90°.

Conventional clock generation systems are beset by various issues that include wasteful power consumption, including in mobile applications where battery power is a precious resource, and inaccurate calibration. Turning again to FIG. 7A, power wastage occurs in an ILO 702 that produces signals at eight different phases when only four phases 712 are used for generating sampling signals. The ILO 702 can expend significant energy on signals that switch at high frequency to produce the unused phases. Inaccuracies in calibration arise from the use of a distinct observation path that requires pulse generation. Calibrated value is affected by phase mismatch ($\varepsilon_{pulsegen}$) introduced by the pulse generation circuits 704. The phase mismatch adds uncertainty to calibration results. Conventional systems suffer from additional drawbacks, including the additional circuitry and power consumption required solely to support observation circuits and enable feedback for calibration purposes. Slight imbalances in circuit layout of the pulse generation circuits 704 can affect the accuracy of the observation and resultant calibration process.

Certain aspects of this disclosure provide a calibration architecture that can conserve power and improve calibration outcomes by removing the dedicated observation path and reducing or eliminating uncertainty in observation of signal phase relationships. In one example, the presently-disclosed calibration architecture can be used with the ILO 300 illustrated in FIG. 3.

Figure 8:
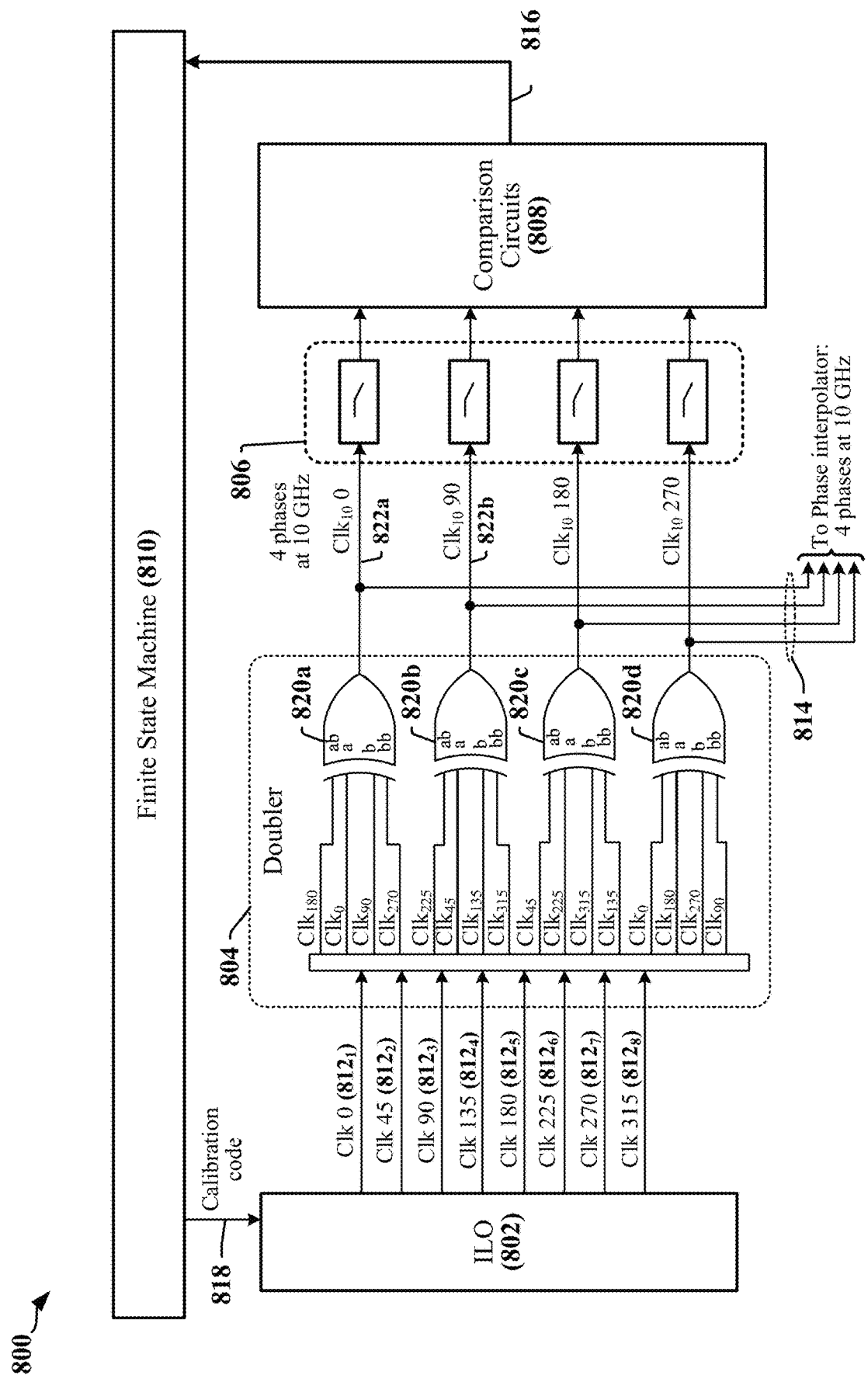
FIG. 8 illustrates an example of a calibration circuit provided in accordance with certain aspects of this disclosure.

FIG. 8 illustrates an example of a calibration system 800 provided in accordance with certain aspects of this disclosure. The calibration system 800 includes a finite state machine 810 that controls the calibration process. The finite state machine 810 responds to the outputs of comparison circuits 808 and provides a calibration code 818 that may be used to configure a supply current and/or injection circuits in an ILO 802. The ILO 802 may correspond to the ILO 300 illustrated in FIG. 3. The ILO 802 may be configured to provide eight phases $812_1$-$812_8$ to a frequency doubler circuit 804. The frequency doubler circuit 804 generates four phases 814 that are provided to a phase interpolator used to provide timing signals to sampling circuits or deserializers. The ILO 802 is operated at half rate, providing substantial power savings and the eight phases $812_1$-$812_8$ provided by the ILO 802 switch at half the frequency of the four phases 814 and the timing signals generated to capture data from the communication link.

The calibration system 800 uses the four phases 814 output by the frequency doubler circuit 804 to calibrate the ILO 802. According to one aspect of this disclosure, the duty cycle of the phases 814 can indicate whether the ideal oscillator frequency has been achieved. In one example, each of the four phases 814 is provided to one of a set of low-pass filters that produces an output representative of average voltage or power of the corresponding phase 814. The average voltage or power of the corresponding phase 814 indicate the duty cycle of the phases 814 and the comparison circuits 808 can indicate when the four comparison circuits 808 are at 50% duty cycle levels. The comparison circuits 808 produce decision signals 816 that can be used by the finite state machine 810 to determine differences in phase offsets in the four phases 814. The finite state machine 810 may respond to the decision signals 816 and/or by configuring a value of the calibration code 818 used to configure injection circuits in the ILO 802.

The relationship between duty cycle and ideal oscillator frequency derives from the configuration and operation of the frequency doubler circuit 804. Eight phases produced by the ILO 802 are provided to the frequency doubler circuit 804, which includes four exclusive OR gates (the XOR gates 820a-820d). Each XOR gate 820a-820d outputs a double rate clock signal from differential inputs that receive a pair of differential phase signals. The input differential phase signals are phase shifted by 90°.

In a first example, a first XOR gate 820a receives the Clk 0 phase $812_1$ as the in-phase differential input and the Clk 90 phase $812_3$ as the quadrature differential input. In this example, the in-phase differential input includes the Clk 180 phase $812_5$ as the inverse of the Clk 0 phase $812_1$ and the quadrature differential input includes the Clk 270 phase $812_7$ as the inverse of the Clk 90 phase $812_3$. The first XOR gate 820a outputs a full rate $Clk_{10}$ 0 signal 822a.

In a second example, a second XOR gate 820b receives the Clk 45 phase $812_2$ as the in-phase differential input and the Clk 135 phase $812_4$ as the quadrature differential input. In this example, the in-phase differential input includes the Clk 225 phase 8126 as the inverse of the Clk 45 phase $812_2$ and the quadrature differential input includes the Clk 315 phase 8128 as the inverse of the Clk 135 phase $812_4$. The first XOR gate 820b outputs a full rate $Clk_{10}$ 90 signal 822b.

FIG. 9 includes a timing diagram 900 that illustrates the operation of the doubler circuit 804. Timing for the first and second XOR gates 820a and 820b is shown. In the first example, relating to the first XOR gate 820a, the in-phase the Clk 0 phase $812_1$ transitions high 908 when the lagging quadrature Clk 90 phase $812_3$ is low causing the full rate $Clk_{10}$ 0 signal 822a to transition high (1⊕0=1). The full rate $Clk_{10}$ 0 signal 822a transitions low when the quadrature Clk 90 phase $812_3$ transitions high 912 and the Clk 0 phase $812_1$ is high since 1⊕1=0. The full rate $Clk_{10}$ 0 signal 822a transitions high again when the Clk 0 phase $812_1$ transitions low and when the lagging Clk 90 phase $812_3$ is high (0⊕1=1.). Accordingly, two pulses are generated in the full rate $Clk_{10}$ 0 signal 822a for every pulse in the in-phase signal.

In the second example relating to the second XOR gate 802b, the in-phase the Clk 45 phase $812_2$ transitions high 910 when the lagging quadrature Clk 135 phase $812_4$ is low causing the full rate $Clk_{10}$ 90 signal 822b to transition high (1⊕0=1). The full rate $Clk_{10}$ 90 signal 822b transitions low when the quadrature Clk 135 phase $812_4$ transitions high at edge 914 when the Clk 45 phase $812_2$ is high since 1⊕1=0. The full rate $Clk_{10}$ 90 signal 822b transitions high again when the Clk 45 phase $812_2$ transitions low when the lagging Clk 135 phase $812_4$ is high (0⊕1=1.). Accordingly, two pulses are generated in the full rate $Clk_{10}$ 90 signal 822b for every pulse in the in-phase signal.

Duty cycle can be observed for I/Q calibration. The duty cycle of the four phases 814 output by the XOR gates 820a-820d is linked to I/Q phase relationship. For example, any differences in the nominal, relative timing of transitions in the Clk 0 phase $812_1$ and the Clk 90 phase $812_3$ affects the duty cycle of the full rate $Clk_{10}$ 0 signal 822a. In the latter example, a delayed edge in the Clk 90 phase $812_3$ signal may change the width of a pulse in the full rate $Clk_{10}$ 0 signal 822a. In one aspect of the disclosure, the comparison circuits 808 can optimize the operation of the ILO 802 to obtain a 50% duty cycle in each of the phases 814. In some examples, the comparison circuits 808 are configured to compare average values of voltage or current obtained using low pass filters 806. The use of the disclosed calibration technique removes the need for generation of extra pulses for observation purposes and avoids corresponding additional mismatches in the observation path.

The ILO 802 is used for I/Q signal generation and needs to target a precise 90° phase delay. The timing diagram 900 illustrates how the I/Q delay can be calibrated. The timing diagram 900 shows that 3 consecutive delays 902 are attributable to the core oscillator delay while 1 in every 4 delays 904 is corrected by the injection mechanism. The sum of these 4 delays 902 and 904 equals 100 ps, or one period of the injected clock. The Clk 135 phase $812_4$ may include the edge 914 that is used as a reference and is locked to the input signal in this example. If the tuning current is too low, each time delay between two consecutive phases is slightly longer than the ideal 25 ps and if the tuning current is too high, each time delay between two consecutive phases is slightly shorter than the ideal 25 ps. The supply or bias current 524 is controlled by a current DAC such as the IDAC 510 illustrated in FIG. 5. The I/Q delay can be precisely measured during phase calibration in order to correctly update the value provided to IDAC 510.

A half rate injection locking oscillator architecture implemented in accordance with certain aspects of this disclosure can be calibrated based on the relationship between I/Q delay and the duty cycle of the output clock signals (the phases 814). Each 10 GHz output clock signal is generated by exclusive-OR combinations of the 5 GHz input signal and the 10 GHz full rate $Clk_{10}$ 0 signal 822a is high during two unit delays of the oscillator and low during one-unit delay of the oscillator, while one-unit delay is corrected by the injection locking mechanism. Based on the example illustrated in the table 920 in FIG. 9, if the oscillator's natural frequency is too slow, each unit delay is 26 ps and therefore the injection locking mechanism will force the last delay to be 22 ps. This results in a 52% duty cycle for the full rate $Clk_{10}$ 0 signal 822a. By similar analysis, the duty cycle of the full rate $Clk_{10}$ 0 signal 822a is 48%.

The combination of half rate oscillator and frequency doubler shows a unique linear relationship between I/Q delay and duty cycle of the output clock at full rate. Consequently, there is no need to add observation circuitry that would consume additional power and introduce uncertainty in the observed I/Q delay. A simple low pass filter to extract the average value of the duty cycle can be used to measure the accuracy of the setting that controls tuning current and the accuracy of the I/Q delay.

FIG. 10 includes a first graph 1000 that illustrates the phase difference between all four output signals at 10 GHz. As the natural oscillation frequency increases, the unit delay between two consecutive signals reduces for three of the phases. The fourth delay is forced by the injection locking mechanism to ensure the locking condition is met (i.e., the sum of the four delays is equal to one full target period). To compensate for the reduced delay of the other three phases, as the natural oscillation frequency increases, the delay between 0° and 90° phases increases with frequency.

FIG. 10 includes a second graph 1020 that illustrates the duty cycle of the output clock signals at 10 GHz. The duty cycle is a linear function of the natural oscillation frequency close to the ideal locking point. Duty cycle reaches an ideal value of 50% only when the I/Q delay is correctly set to 90°. It should be noted that, as the oscillator is current starved, some bias conditions cause a current path between a current DAC in the injection device used to generate the injection current and the main current DAC used to generate a tuning current ($i_{tune}$). In other words, a portion of the injection current is added to the tuning current, which can reduce the frequency of the ideal locked point.

Certain techniques disclosed herein may be implemented in a clock generation circuit that has an injection-locked oscillator having an input coupled to a half-rate clock signal, a frequency doubler circuit having a plurality of inputs coupled to a plurality of outputs of the injection-locked oscillator, low pass filters, each having an input coupled to one of a plurality of outputs of the frequency doubler circuit, and a calibration circuit that includes comparison logic that receives outputs of the low pass filters and that has an output coupled to a control input of a source of a supply current in the injection-locked oscillator. In one example, the injection-locked oscillator is configured to generate a plurality of phases of a half-rate clock signal. In one example, the frequency doubler circuit that receives the plurality of phases of the half-rate clock signal and provides a plurality of phases of a full-rate clock signal. In one example, the low pass filters are configured to receive the plurality of phases of the full-rate clock signal. In one example, the calibration circuit is configured to control an injection circuit in the injection-locked oscillator based on a comparison of outputs of the low pass filters. The calibration circuit may be implemented using a finite state machine or other processing circuit.

In some examples, the source of the supply current in the injection-locked oscillator includes a digital-to-analog converter. The comparison logic may be configured to compare the outputs of the low pass filters. The frequency doubler circuit may include exclusive-OR gates, each having inputs coupled to a differential signal provided by two of the plurality of outputs of the injection-locked oscillator. The calibration circuit may include a finite state machine. The injection-locked oscillator may include a plurality of inverters connected in the loop. Each inverter may have an input driven by a preceding stage and an output that drives a next stage. Each of the plurality of outputs of the injection-locked oscillator may be coupled to an output of one of the plurality of inverters connected in the loop. The injection-locked oscillator may include back-to-back inverters coupled across the loop and between pairs of the plurality of inverters connected in the loop, and an injection circuit coupled across the loop and between a pair of the plurality of inverters connected in the loop. The injection-locked oscillator may include one or more phase interpolators having inputs coupled to the plurality of outputs of the frequency doubler circuit, and one or more sampling circuits, each receiving outputs of the one or more phase interpolators as inputs. An input of each of the one or more sampling circuits may be coupled to a data channel of a serial communication link.

Figure 11:
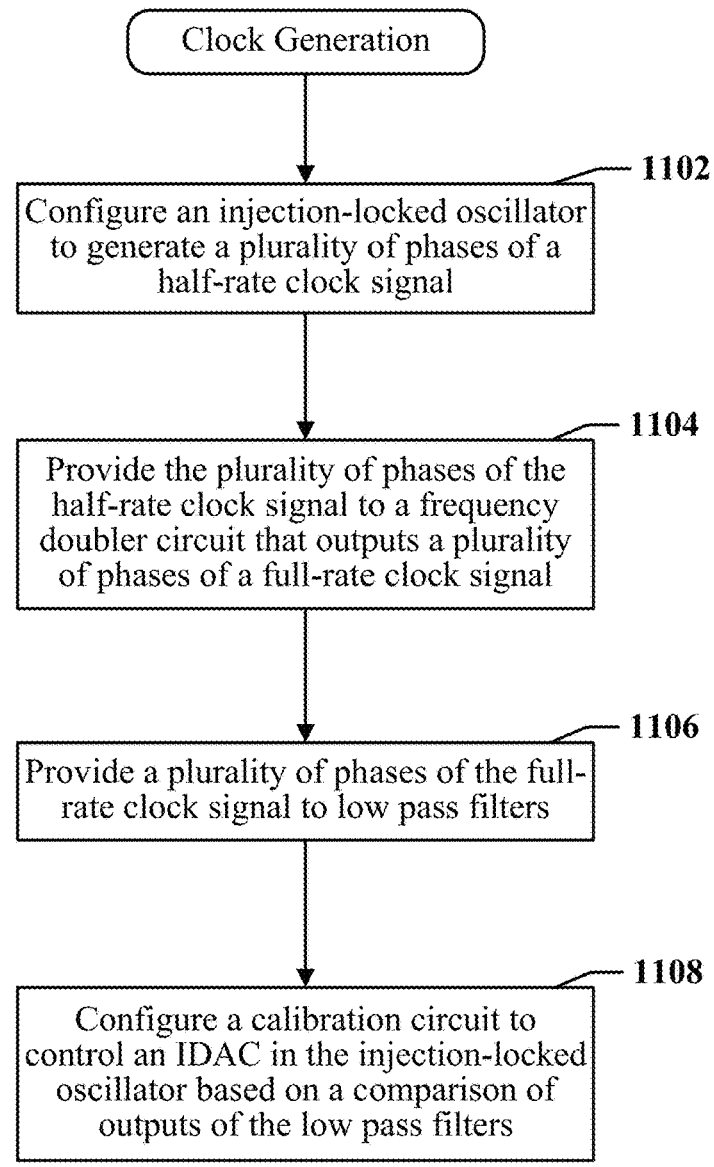
FIG. 11 is a flow diagram illustrating an example of a method for calibrating a clock generation circuit.

FIG. 11 is a flow diagram illustrating an example of a method 1100 for calibrating a clock generation circuit. The oscillator may correspond to the ILO 300 of FIG. 3 or the ILO 802 of FIG. 8. The method 1100 may be implemented in a receiver coupled to a multi-channel data communication link. In some examples, the method 1100 may relate to a calibration circuit using a finite state machine or other processor.

At block 1102, an injection-locked oscillator may be configured to generate a plurality of phases of a half-rate clock signal. At block 1104, the plurality of phases of the half-rate clock signal may be provided to a frequency doubler circuit that outputs a plurality of phases of a full-rate clock signal. At block 1106, a plurality of phases of the full-rate clock signal may be provided to low pass filters. At block 1108, a calibration circuit may be configured to control an IDAC in the injection-locked oscillator based on a comparison of outputs of the low pass filters.

In some examples, the plurality of phases of the full-rate clock signal may be generated by performing an exclusive-OR on signals representative of two of the plurality of phases of the full-rate clock signal. The calibration circuit may be configured to provide a supply current to the injection-locked oscillator. The supply current may have a magnitude configured based on the comparison of the outputs of the low pass filters. The calibration circuit may be configured to iteratively adjust the magnitude of the supply current until the outputs of the low pass filters are equal.

In certain examples, the low pass filters may be used to generate signals representative of duty cycles of corresponding phases of the full-rate clock signal. The method may include determining that each of the plurality of phases of the full-rate clock signal has a 50% duty cycle when the outputs of the low pass filters are equal. The plurality of phases of the half-rate clock signal may include half-rate signals that are phase shifted with respect to one another. The plurality of phases of the full-rate clock signal may include full-rate signals that are phase shifted with respect to one another. The method may include providing the plurality of phases of the full-rate clock signal to one or more phase interpolators, each phase interpolator providing timing information for sampling a data channel of a serial communication link.

It is also that the operational steps described in any of the exemplary aspects herein are described to provide examples. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flow diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various operations of methods described above may be performed by any suitable means capable of performing the corresponding functions. The means may include various hardware and/or software component(s) and/or module (s), including, but not limited to a circuit, an application-specific integrated circuit (ASIC), or processor. Generally, where there are operations illustrated in figures, those operations may have corresponding counterpart means-plus-function components with similar numbering. In certain aspects, an apparatus includes means for configuring an injection-locked oscillator to generate a plurality of phases of a half-rate clock signal, means for doubling the frequency of the plurality of phases of the half-rate clock signal to obtain a plurality of phases of a full-rate clock signal, means for comparing the plurality of phases of the full-rate clock signal including low pass filters configured to output low-pass filtered versions of the plurality of phases of the full-rate clock signal, and means for controlling a supply current in the injection-locked oscillator, including a current digital-to-analog converter configured to provide the circuit responsive to a comparison of outputs of the low pass filters.

In some examples, the means for controlling the supply current is further configured to provide a supply current to the injection-locked oscillator. The means for doubling the frequency of the plurality of phases of the half-rate clock signal comprises exclusive-OR gates configured to operate as frequency doubler circuits that receive differential signals representative of two of the plurality of phases of the full-rate clock signal. The supply current may have a magnitude configured based on the comparison of the outputs of the low pass filters. The means for controlling the supply current may be configured to iteratively adjust the magnitude of the supply current until the outputs of the low pass filters are equal.

In some examples, signals output by the low pass filters correspond to duty cycles of corresponding phases of the full-rate clock signal. Each of the plurality of phases of the full-rate clock signal may have a 50% duty cycle when the outputs of the low pass filters are equal. The means for controlling the supply current may include a finite state machine. The plurality of phases of the half-rate clock signal may include half-rate signals that are phase shifted with respect to one another. The plurality of phases of the full-rate clock signal may include full-rate signals that are phase shifted with respect to one another. The plurality of phases of the full-rate clock signal may be provided to one or more phase interpolators. Each phase interpolator may provide timing information for sampling a data channel of a serial communication link.

Some implementation examples are described in the following numbered clauses:

1. A clock generation circuit, comprising: an injection-locked oscillator having an input coupled to a half-rate clock signal; a frequency doubler circuit having a plurality of inputs coupled to a plurality of outputs of the injection-locked oscillator; low pass filters, each having an input coupled to one of a plurality of outputs of the frequency doubler circuit; and a calibration circuit that comprises comparison logic that receives outputs of the low pass filters and that has an output coupled to a control input of a source of a supply current in the injection-locked oscillator.
2. The clock generation circuit as described in clause 1, wherein the source of the supply current in the injection-locked oscillator comprises a digital-to-analog converter.
3. The clock generation circuit as described in clause 1 or clause 2, wherein the comparison logic is configured to compare the outputs of the low pass filters.
4. The clock generation circuit as described in any of clauses 1-3, wherein the frequency doubler circuit comprises exclusive-OR gates, each having inputs coupled to a differential signal provided by two of the plurality of outputs of the injection-locked oscillator.
5. The clock generation circuit as described in any of clauses 1-4, wherein the calibration circuit further comprises a finite state machine.
6. The clock generation circuit as described in any of clauses 1-5, wherein the injection-locked oscillator comprises a plurality of inverters connected in the loop, each inverter having an input driven by a preceding stage and an output that drives a next stage.
7. The clock generation circuit as described in clause 6, wherein each of the plurality of outputs of the injection-locked oscillator is coupled to an output of one of the plurality of inverters connected in the loop.
8. The clock generation circuit as described in clause 6 or clause 7, wherein the injection-locked oscillator comprises: back-to-back inverters coupled across the loop and between pairs of the plurality of inverters connected in the loop; and an injection circuit coupled across the loop and between a pair of the plurality of inverters connected in the loop.
9. The clock generation circuit as described in any of clauses 1-8, wherein the injection-locked oscillator comprises: one or more phase interpolators having inputs coupled to the plurality of outputs of the frequency doubler circuit; and one or more sampling circuits, each receiving outputs of the one or more phase interpolators as inputs.
10. The clock generation circuit as described in clause 9, wherein an input of each of the one or more sampling circuits is coupled to a data channel of a serial communication link.
11. An apparatus, comprising: means for configuring an injection-locked oscillator to generate a plurality of phases of a half-rate clock signal; means for doubling the frequency of the plurality of phases of the half-rate clock signal to obtain a plurality of phases of a full-rate clock signal; means for comparing the plurality of phases of the full-rate clock signal including low pass filters configured to output low-pass filtered versions of the plurality of phases of the full-rate clock signal; and means for controlling a supply current in the injection-locked oscillator, including a current digital-to-analog converter configured to provide the circuit responsive to a comparison of outputs of the low pass filters.
12. The apparatus as described in clause 11, wherein the means for controlling the supply current is further configured to provide a supply current to the injection-locked oscillator.
13. The apparatus as described in clause 11 or clause 12, wherein the means for doubling the frequency of the plurality of phases of the half-rate clock signal comprises exclusive-OR gates configured to operate as frequency doubler circuits that receive differential signals representative of two of the plurality of phases of the full-rate clock signal.
14. The apparatus as described in any of clauses 11-13, wherein the supply current has a magnitude configured based on the comparison of the outputs of the low pass filters.
15. The apparatus as described in clause 14, wherein the means for controlling the supply current is configured to iteratively adjust the magnitude of the supply current until the outputs of the low pass filters are equal.
16. The apparatus as described in any of clauses 11-15, wherein outputs of the low pass filters correspond to duty cycles of corresponding phases of the full-rate clock signal.
17. The apparatus as described in clause 16, wherein each of the plurality of phases of the full-rate clock signal has a 50% duty cycle when the outputs of the low pass filters are equal.
18. The apparatus as described in any of clauses 11-17, wherein the means for controlling the supply current comprises a finite state machine.
19. The apparatus as described in any of clauses 11-18, wherein the plurality of phases of the half-rate clock signal comprises half-rate signals that are phase shifted with respect to one another, and wherein the plurality of phases of the full-rate clock signal comprises full-rate signals that are phase shifted with respect to one another.
20. The apparatus as described in any of clauses 11-19, wherein the plurality of phases of the full-rate clock signal are provided to one or more phase interpolators, each phase interpolator providing timing information for sampling a data channel of a serial communication link.
21. A method for calibrating a clock generation circuit, comprising: configuring an injection-locked oscillator to generate a plurality of phases of a half-rate clock signal; providing the plurality of phases of the half-rate clock signal to a frequency doubler circuit that outputs a plurality of phases of a full-rate clock signal; providing a plurality of phases of the full-rate clock signal to low pass filters; and configuring a calibration circuit to control a current digital-to analog converter (IDAC) in the injection-locked oscillator based on a comparison of outputs of the low pass filters.
22. The method as described in clause 21, further comprising: generating the plurality of phases of the full-rate clock signal by performing an exclusive-OR on signals representative of two of the plurality of phases of the full-rate clock signal.
23. The method as described in clause 21 or clause 22, wherein the calibration circuit is configured to provide a supply current to the injection-locked oscillator.
24. The method as described in any of clauses 21-23, wherein the supply current has a magnitude configured based on the comparison of the outputs of the low pass filters.
25. The method as described in clause 24, wherein the calibration circuit is configured to iteratively adjust the magnitude of the supply current until the outputs of the low pass filters are equal.
26. The method as described in any of clauses 21-25, further comprising: using the low pass filters to generate signals representative of duty cycles of corresponding phases of the full-rate clock signal.
27. The method as described in clause 26, further comprising: determining that each of the plurality of phases of the full-rate clock signal has a 50% duty cycle when the outputs of the low pass filters are equal.
28. The method as described in any of clauses 21-27, wherein the plurality of phases of the half-rate clock signal comprises half-rate signals that are phase shifted with respect to one another, and wherein the plurality of phases of the full-rate clock signal comprises full-rate signals that are phase shifted with respect to one another.
29. The method as described in any of clauses 21-28, further comprising: providing the plurality of phases of the full-rate clock signal to one or more phase interpolators, each phase interpolator providing timing information for sampling a data channel of a serial communication link.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The present disclosure is provided to enable any person skilled in the art to make or use aspects of the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A clock generation circuit, comprising:
   an injection-locked oscillator having an input coupled to a half-rate clock signal;
   a frequency doubler circuit having a plurality of inputs coupled to a plurality of outputs of the injection-locked oscillator;
   low pass filters, each having an input coupled to one of a plurality of outputs of the frequency doubler circuit; and
   a calibration circuit that comprises comparison logic that receives outputs of the low pass filters and that has an output coupled to a control input of a source of a supply current in the injection-locked oscillator.

2. The clock generation circuit of claim 1, wherein the source of the supply current in the injection-locked oscillator comprises a digital-to-analog converter.
3. The clock generation circuit of claim 1, wherein the comparison logic is configured to compare the outputs of the low pass filters.
4. The clock generation circuit of claim 1, wherein the frequency doubler circuit comprises exclusive-OR gates, each having inputs coupled to a differential signal provided by two of the plurality of outputs of the injection-locked oscillator.
5. The clock generation circuit of claim 1, wherein the calibration circuit further comprises a finite state machine.
6. The clock generation circuit of claim 1, wherein the injection-locked oscillator comprises a plurality of inverters connected in a loop, each inverter having an input driven by a preceding stage and an output that drives a next stage.
7. The clock generation circuit of claim 6, wherein each of the plurality of outputs of the injection-locked oscillator is coupled to an output of one of the plurality of inverters connected in the loop.
8. The clock generation circuit of claim 6, wherein the injection-locked oscillator comprises:
   back-to-back inverters coupled across the loop and between pairs of the plurality of inverters connected in the loop; and
   an injection circuit coupled across the loop and between a pair of the plurality of inverters connected in the loop.
9. The clock generation circuit of claim 1, wherein the injection-locked oscillator comprises:
   one or more phase interpolators having inputs coupled to the plurality of outputs of the frequency doubler circuit; and
   one or more sampling circuits, each receiving outputs of the one or more phase interpolators as inputs.
10. The clock generation circuit of claim 9, wherein an input of each of the one or more sampling circuits is coupled to a data channel of a serial communication link.
11. An apparatus, comprising:
    means for configuring an injection-locked oscillator to generate a plurality of phases of a half-rate clock signal;
    means for doubling frequency of the plurality of phases of the half-rate clock signal to obtain a plurality of phases of a full-rate clock signal;
    means for comparing the plurality of phases of the full-rate clock signal including low pass filters configured to output low-pass filtered versions of the plurality of phases of the full-rate clock signal; and
    means for controlling a supply current in the injection-locked oscillator, including a current digital-to-analog converter configured to provide a level of the supply current responsive to a comparison of outputs of the low pass filters.
12. The apparatus of claim 11, wherein the means for controlling the supply current is further configured to provide a supply current to the injection-locked oscillator.
13. The apparatus of claim 11, wherein the means for doubling the frequency of the plurality of phases of the half-rate clock signal comprises exclusive-OR gates configured to operate as frequency doubler circuits that receive differential signals representative of two of the plurality of phases of the full-rate clock signal.
14. The apparatus of claim 11, wherein the supply current has a magnitude configured based on a comparison of outputs of the low pass filters.

15. The apparatus of claim 14, wherein the means for controlling the supply current is configured to iteratively adjust the magnitude of the supply current until the outputs of the low pass filters are equal.

16. The apparatus of claim 11, wherein outputs of the low pass filters correspond to duty cycles of corresponding phases of the full-rate clock signal.

17. The apparatus of claim 16, wherein each of the plurality of phases of the full-rate clock signal has a 50% duty cycle when the outputs of the low pass filters are equal.

18. The apparatus of claim 11, wherein the means for controlling the supply current comprises a finite state machine.

19. The apparatus of claim 11, wherein the plurality of phases of the half-rate clock signal comprises half-rate signals that are phase shifted with respect to one another, and wherein the plurality of phases of the full-rate clock signal comprises full-rate signals that are phase shifted with respect to one another.

20. The apparatus of claim 11, wherein the plurality of phases of the full-rate clock signal are provided to one or more phase interpolators, each phase interpolator providing timing information for sampling a data channel of a serial communication link.

21. A method for calibrating a clock generation circuit, comprising:
   configuring an injection-locked oscillator to generate a plurality of phases of a half-rate clock signal;
   providing the plurality of phases of the half-rate clock signal to a frequency doubler circuit that outputs a plurality of phases of a full-rate clock signal;
   providing a plurality of phases of the full-rate clock signal to low pass filters; and
   configuring a calibration circuit to control a current digital-to analog converter (IDAC) in the injection-locked oscillator based on a comparison of outputs of the low pass filters.

22. The method of claim 21, further comprising:
   generating the plurality of phases of the full-rate clock signal by performing an exclusive-OR on signals representative of two of the plurality of phases of the full-rate clock signal.

23. The method of claim 21, wherein the calibration circuit is configured to provide a supply current to the injection-locked oscillator.

24. The method of claim 23, wherein the supply current has a magnitude configured based on the comparison of the outputs of the low pass filters.

25. The method of claim 23, wherein the calibration circuit is configured to iteratively adjust magnitude of the supply current until the outputs of the low pass filters are equal.

26. The method of claim 21, further comprising:
   using the low pass filters to generate signals representative of duty cycles of corresponding phases of the full-rate clock signal.

27. The method of claim 26, further comprising:
   determining that each of the plurality of phases of the full-rate clock signal has a 50% duty cycle when the outputs of the low pass filters are equal.

28. The method of claim 21, wherein the plurality of phases of the half-rate clock signal comprises half-rate signals that are phase shifted with respect to one another, and wherein the plurality of phases of the full-rate clock signal comprises full-rate signals that are phase shifted with respect to one another.

29. The method of claim 21, further comprising:
   providing the plurality of phases of the full-rate clock signal to one or more phase interpolators, each phase interpolator providing timing information for sampling a data channel of a serial communication link.

* * * * *